(12) United States Patent
Rando et al.

(10) Patent No.: US 6,327,090 B1
(45) Date of Patent: *Dec. 4, 2001

(54) MULTIPLE LASER BEAM GENERATION

(75) Inventors: Joseph F. Rando, Los Altos Hills; Timothy J. Litvin, Santa Cruz, both of CA (US)

(73) Assignee: Levelite Technology, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/686,128

(22) Filed: Oct. 10, 2000

Related U.S. Application Data

(63) Continuation-in-part of application No. 09/438,890, filed on Nov. 12, 1999, now Pat. No. 6,154,319, which is a continuation-in-part of application No. 08/887,778, filed on Jul. 3, 1997, now Pat. No. 6,005,716.

(51) Int. Cl.$^7$ .................................................. G02B 27/10
(52) U.S. Cl. ................................ 359/618; 359/636; 430/5
(58) Field of Search ........................... 359/618, 627–629, 359/633, 636, 471, 482; 430/5, 945; 356/138, 149

(56) References Cited

U.S. PATENT DOCUMENTS

| 543,730 | 7/1895 | Heap | 359/618 |
|---|---|---|---|
| 3,452,207 | 6/1969 | Tsukkerman | 250/215 |
| 3,663,890 | 5/1972 | Schulthess | 331/94.5 |
| 3,897,637 | 8/1975 | Genho | 33/227 |
| 4,111,564 | 9/1978 | Trice, Jr. | 356/247 |
| 4,333,242 | 6/1982 | Genho, Sr. | 33/227 |
| 4,516,244 | 5/1985 | Holmes | 372/99 |
| 4,679,937 | 7/1987 | Cain et al. | 356/138 |
| 4,767,208 | 8/1988 | Cain et al. | 356/138 |
| 4,852,265 | 8/1989 | Rando et al. | 33/227 |
| 5,144,486 | 9/1992 | Hart | 359/629 |
| 5,144,487 | 9/1992 | Hersey | 359/629 |
| 5,161,238 | 11/1992 | Mehmke | 359/738 |
| 5,381,439 | 1/1995 | English, Jr. | 372/108 |
| 5,459,932 | 10/1995 | Rando et al. | 33/291 |
| 5,500,524 | 3/1996 | Rando | 250/216 |
| 5,524,352 | 6/1996 | Rando et al. | 33/291 |
| 5,541,727 | * 7/1996 | Rando et al. | 356/149 |
| 5,617,202 | 4/1997 | Rando | 356/138 |
| 5,619,802 | 4/1997 | Rando et al. | 33/291 |
| 6,005,716 | 12/1999 | Ligtenberg | 359/618 |
| 6,067,152 | * 5/2000 | Rando | 356/152.1 |
| 6,154,319 | 11/2000 | Rando et al. | 359/618 |

FOREIGN PATENT DOCUMENTS

| 2738348 | 9/1978 | (DE) . |
|---|---|---|
| 3502382 | 9/1985 | (DE) . |
| 8717983 | 3/1992 | (DE) . |
| 4137560 | 2/1993 | (DE) . |
| 3434765 | 5/1998 | (DE) . |
| 1167818 | 12/1987 | (JP) . |

* cited by examiner

Primary Examiner—Huy Mai
(74) Attorney, Agent, or Firm—Thomas M. Freiburger

(57) ABSTRACT

A system which is preferably employed in a laser alignment instrument produces up to five orthogonal beams from a single laser diode beam. In one embodiment the optics take advantage of the elliptical shape of the beam from a laser diode which when collimated produces a plurality of orthogonal beams by reflection off a plurality of 45°-angled reflective surfaces intercepting outer portions of the beam. In one preferred embodiment a solid reflective element was four 45°-angled facets to produce four beams from outer portions of a preferably non-elliptical beam, and a fifth orthogonal beam is produced by transmission of a central portion of the beam through the element. The element can be solid glass, or it can be glass or other material with a central hole.

25 Claims, 10 Drawing Sheets

MULTIPLE LASER BEAM GENERATION

This is a continuation-in-part of application Ser. No. 09/438,890, filed Nov. 12, 1999, now U.S. Pat. No. 6,154,319, which was continuation-in-part of application Ser. No. 08/887,778, filed Jul. 3, 1997, now U.S. Pat. No. 6,005,716. The disclosures of the above application and patent are incorporated herein by reference.

BACKGROUND AND SUMMARY OF THE INVENTION

This invention is concerned with laser diodes and more specifically with the efficient generation of three, four or five intersecting laser beams which are mutually orthogonal. These beams are used in alignment applications where the beams represent reference lines. Other beam generators are described in U.S. Pat. Nos. 5,500,524 and 5,617,202 assigned to the assignee of this invention and the disclosures of those patents are incorporated by reference in this application.

Generally, visible laser diodes have a much wider divergence in the direction perpendicular to the junction than that parallel to the junction. Typical values are 35° in one axis and 10° in the other. Normally, the central zone or portion of the beam is apertured to produce a beam which is nearly round, cropping a portion of the beam's power. If other beams are required, a beam splitter and subsequent optics are used to manipulate the newly created beam. The present invention in one embodiment uses the elliptical or oblong shape of the collimated beam from a diode laser to generate three parallel beams, which can subsequently produce five beams of light by using partial reflection and transmission. The beams form an xyz coordinate system which can be used as reference lines. A collimated laser beam which is not necessarily oblong can be used to produce multiple reflected beams using reflective surfaces positioned at different portions of the path of the collimated beam. One beam can be generated simply by transmission, without reflection.

According to the invention, the basic method used to generate orthogonal and intersecting alignment laser beams includes collimating the laser beam from a laser diode, then reflecting portions of the beam and in some embodiments transmitting a portion of the beam. To achieve the precise beam angles required, the angles between the normal to the reflector surfaces and the transmitted beams must be 45°. This angular relationship will become clear from the drawings. The beam angle relative to the reflectors must be adjusted to achieve accuracy in the resulting instrument. This may be done by tipping the reflector or by adjusting the position of the collimating lens.

DESCRIPTION OF THE DRAWINGS

The accompanying drawings, which are incorporated in and constitute part of the specification, schematically illustrate a preferred embodiment of the invention and, together with the general description given below, serve to explain the principles of the invention.

DESCRIPTION OF PREFERRED EMBODIMENTS

Figure 1:
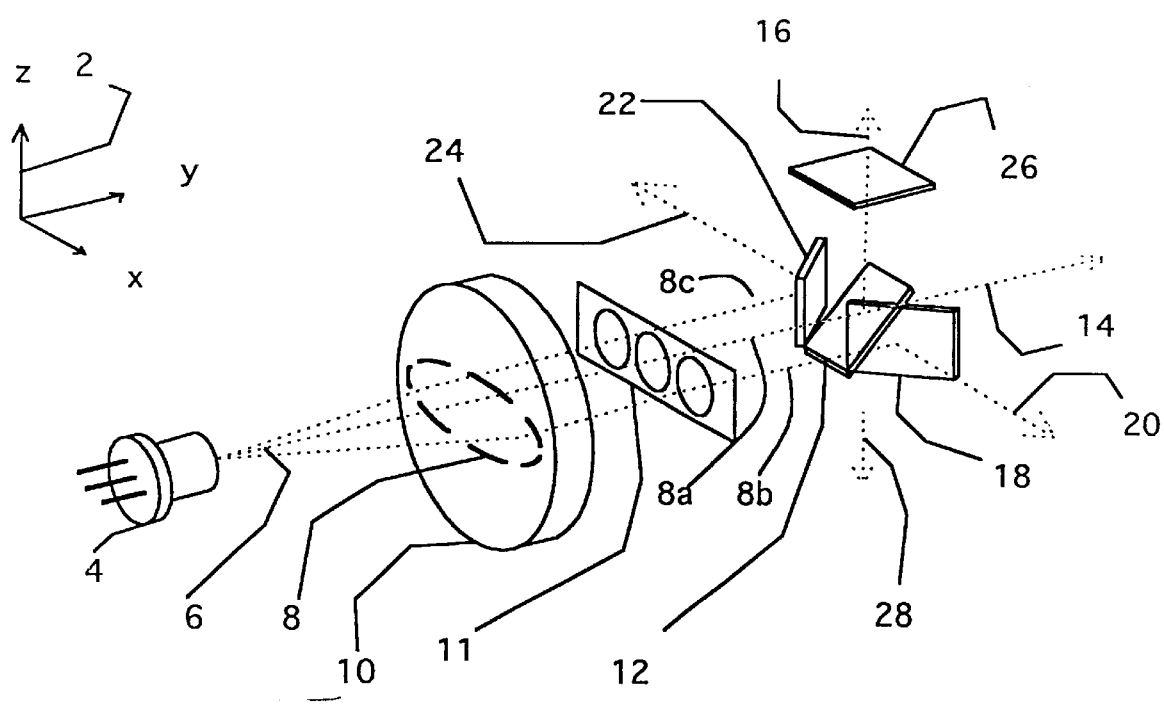
FIG. 1 schematically illustrates a general view of the invention showing how five intersecting laser beams are generated.

Referring now to the drawings, a preferred embodiment is shown in FIG. 1. Xyz coordinates of the system are designated by the number 2. A laser diode 4 is pointed along the y axis generating an elliptical beam 6, as is typical. The resulting elliptical profile on a lens 10 is indicated by a dotted line 8. The lens collimates the beam along the y axis, and the beam continues elliptical with the long axis of the ellipse shown horizontal in the figure.

Beyond the lens 10, a mask 11 with three holes, in a pattern aligned generally in a common plane with the long axis of the elliptical beam, defines three beams 8a, 8b and 8c. The central beam portion 8a strikes an oblique beam splitter 12 creating a transmitted beam output 14 along the y axis and a reflected beam output 16 along the z axis. The angle between the beam splitter 12 and the y axis is 45°. The mask serves only to separate the beams approaching the beam splitter and mirrors and can be eliminated.

A second portion of the beam 8b strikes a mirror 18 creating an output beam 20 which is directed along the x axis. Again, the angle between the mirror and the beam 8b is 45°. A remaining portion of the beam strikes another 45° mirror 22 creating a reflected output beam 24 which is aligned to the minus x axis. In this way four orthogonal output beams are generated.

To generate a fifth output beam, a partially reflecting mirror 26 is in the xy plane and reflects part of the beam 16 back along the z axis, in the minus z direction. Part of this beam is transmitted by the beam splitter 12 giving rise to an output beam 28 which travels along the minus z axis. This beam 28 is much weaker than the other beams but is sufficient to locate the intersection of the other beams for alignment purposes. For example, a reflection of 80% and 25% for the two beam splitters 12 and 26 gives rise to a z-directed beam of 60% of the central zone (8a) power and a minus z-directed beam of 16%. The transmitted y-directed beam 16 has 20% of the central zone power; 4% is lost by reflection back toward the mask and diode. Since the power is highest in the center there is still sufficient power to be useful. In this way five orthogonal beams are generated.

Figure 2:
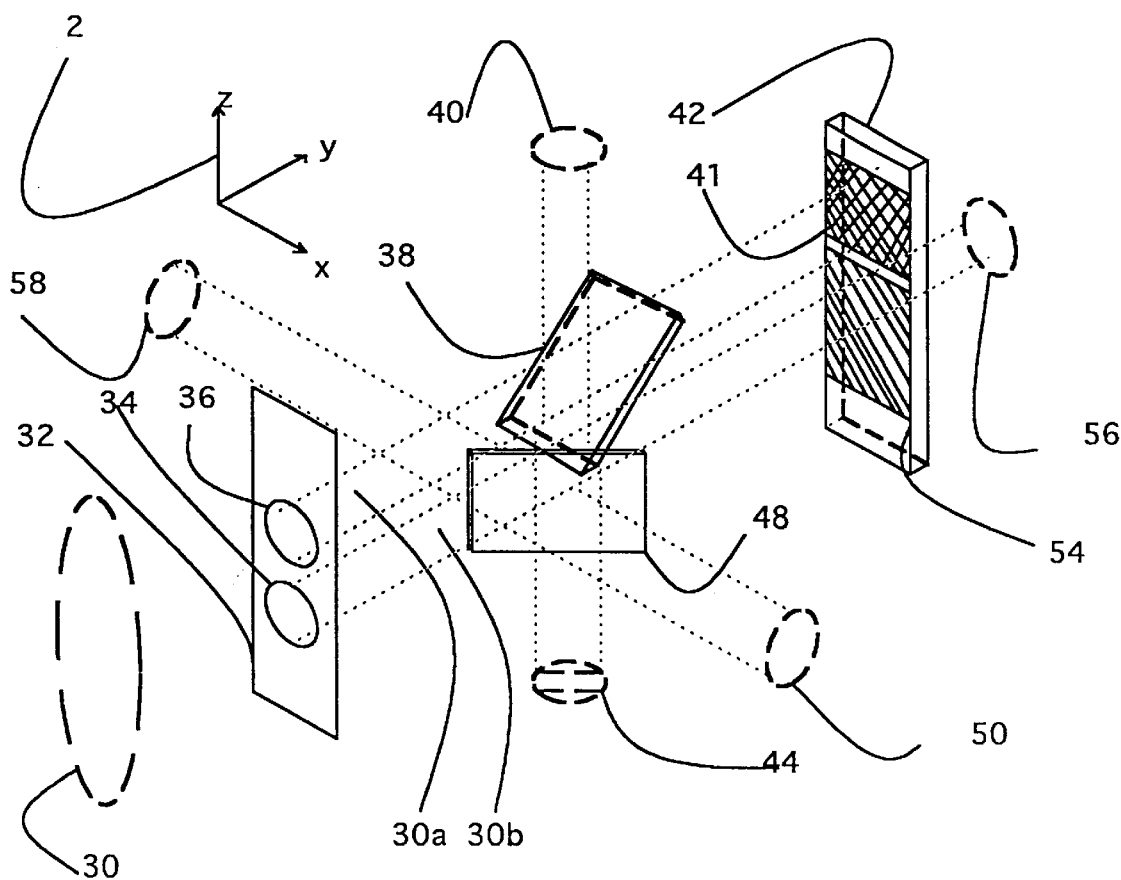
FIG. 2 schematically illustrates an alternate method used to generate five intersecting beams.

In FIG. 2, showing another embodiment, the same xyz coordinate system is used to describe the beam generating process. The elliptical beam 30 from a laser diode is apertured by a mask 32 with circular holes 34 and 36. The upper beam 30a generated by the hole 36 is reflected by a 45° beam splitter 38 generating an output beam 40 which propagates along the +z axis. The transmitted portion of the beam is fully reflected by a mirror coating 41 of a glass substrate 42 back to the beam splitter 38 where it is reflected by a back side reflective coating, along the z axis, forming an output beam 44. This beam is obstructed by the edge of a lower beam splitter 48. Nevertheless, there is sufficient laser power to make this beam visible at short distances.

The beam 30b which is generated by the mask hole 34 strikes the 45°-angled beam splitter 48 producing a reflected output beam 50 propagating along the x axis and a transmitted portion which strikes a reflecting/transmitting coating 54 on the substrate 42, creating a transmitted output beam 56 and reflecting a portion back to the beam splitter 48 (the back of which is reflective), where it generates an output beam 58 propagating in the minus x direction. Again the illustrated system functions well without the mask, which can be eliminated if desired.

Figure 3A:
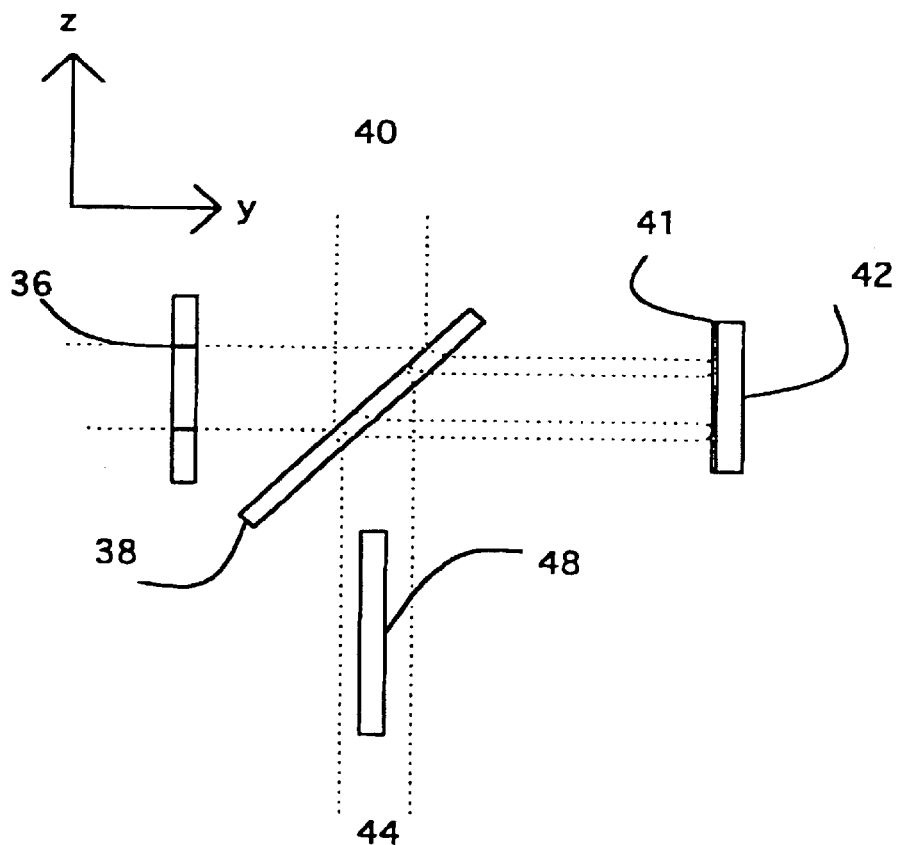
FIG. 3A is an orthographic, schematic view of the system of FIG. 2 looking along the x axis as represented in FIG. 2, i.e., a right side elevation view of the system as seen in FIG. 2.
Figure 3B:
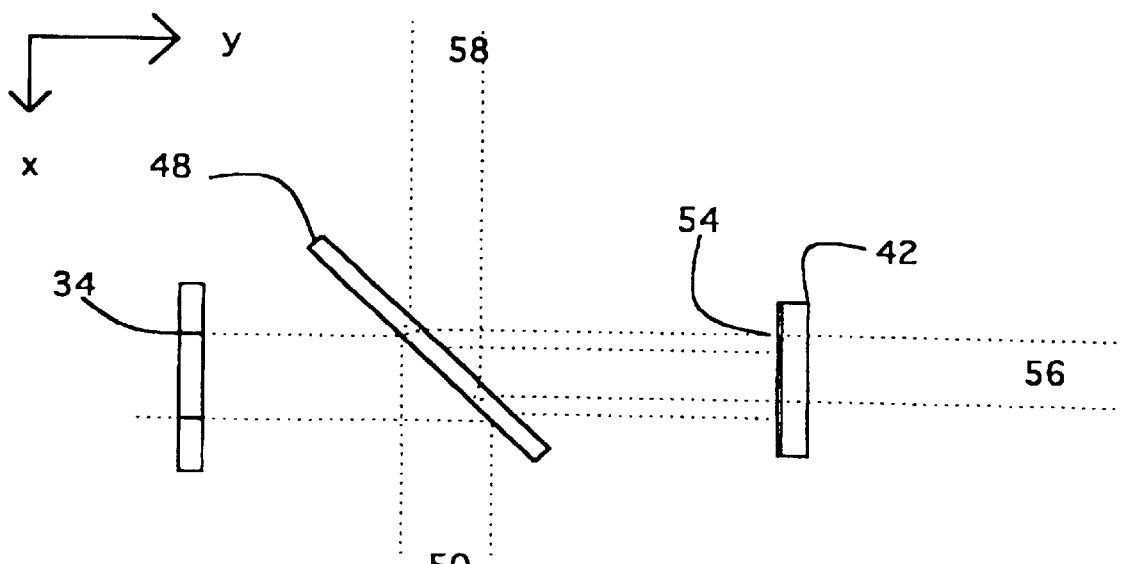
FIG. 3B is an orthographic, schematic view of the system of FIG. 2 looking along the z axis, i.e., a top plan view of the system shown in FIG. 2.

FIGS. 3A and 3B illustrate the five beam generation process of FIG. 2 by showing orthographic views with artificial beam separation. Corresponding elements have the same number designation as in FIG. 2.

Figure 4:
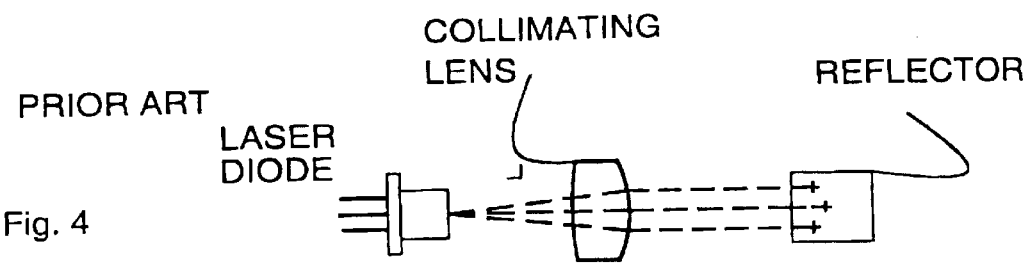
FIGS. 4 and 5 schematically show in plan view and elevation view a prior art system of generating two collinear and intersecting beams from a single laser beam, as described in U.S. Pat. No. 5,500,524.
Figure 5:
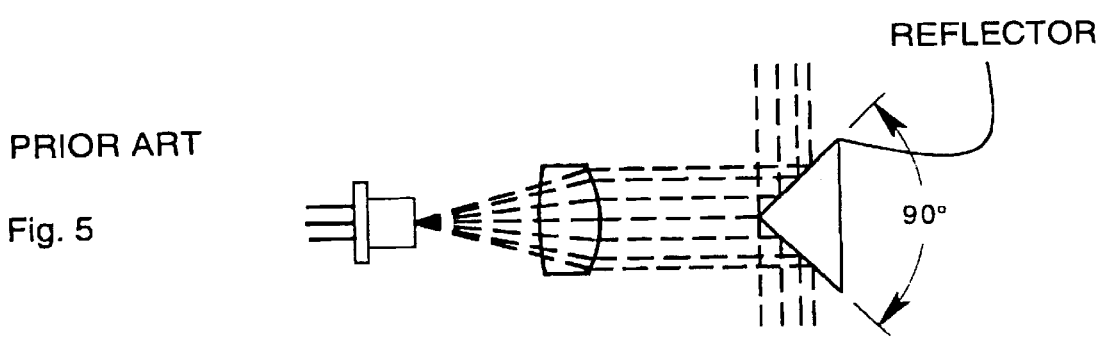

FIGS. 4 and 5 show a basic prior art method for generating two collinear beams, using reflective surfaces which divide the collimated beam into two collinear beams. This is the basic system described in U.S. Pat. No. 5,500,524. A collimated laser beam simply is divided substantially into halves by the pair of 45°-angled surfaces (90° to one another) of the reflector, producing the oppositely-directed collinear beams.

Figure 6:
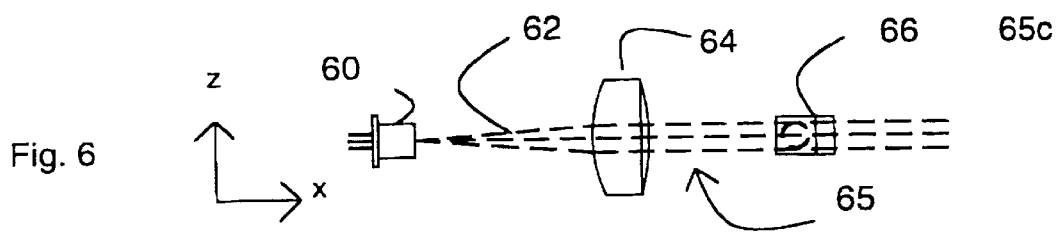
FIG. 6 shows in schematic plan view a method for generating three beams according to the invention, using a prism with a window section for a middle portion of the input beam.
Figure 7:
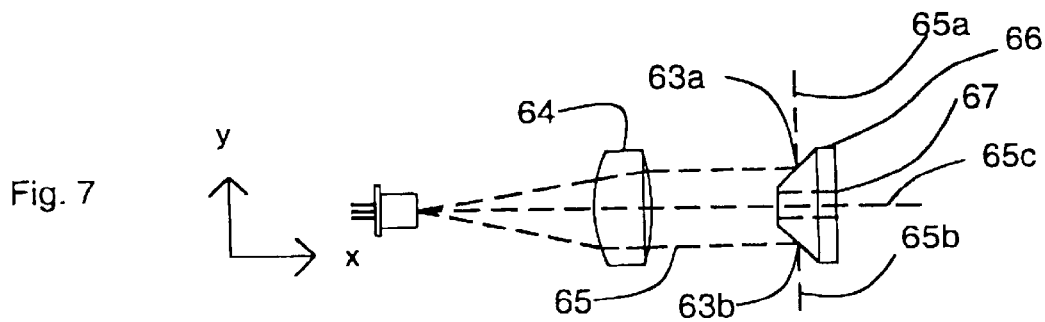
FIG. 7 is an elevation view of the arrangement shown in FIG. 6.

A preferred embodiment for generating three beams in one plane and with the beams at 90° to each other is shown in FIG. 6 and FIG. 7. These are the plan and elevation views of the apparatus. A laser diode 60 generates a diverging beam of light 62 which is collimated by a lens 64 into a collimated beam 65 of desired volume. A reflector element 66, preferably a glass reflector, is coated for high reflective on two 45° faces 63a and 63b, and uncoated on other surfaces. The angle between the two reflecting faces is precisely 90°, and these surfaces produce collinear beams 65a and 65b from outer portions of the beam 65. A center portion 65c of the beam 65 is transmitted in a direct line, without reflection. The entry and exit transmitting surfaces of the element 66, in the case where the element is a solid glass block, are parallel to each other to avoid any prism effect.

In a preferred embodiment of FIG. 8, 9, and 10A–C, the reflective facets of a frustrated pyramid 72 generate four reflected beams while the center of the pyramid comprises a window 75 which transmits a fifth beam. A laser diode 68 in this embodiment produces a more nearly round beam when collimated into the beam 69 which is incident on all the facets of the pyramid.

Figure 8:
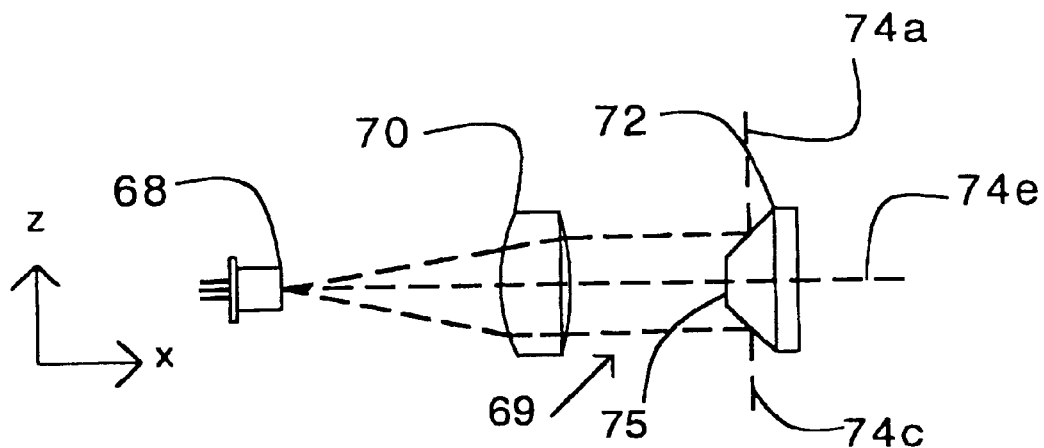
FIG. 8 is a schematic plan view showing a method of the invention for generating five intersecting light beams using reflective surfaces positioned at different portions of the incoming beam, with a window section for a central portion of the beam.
Figure 9:
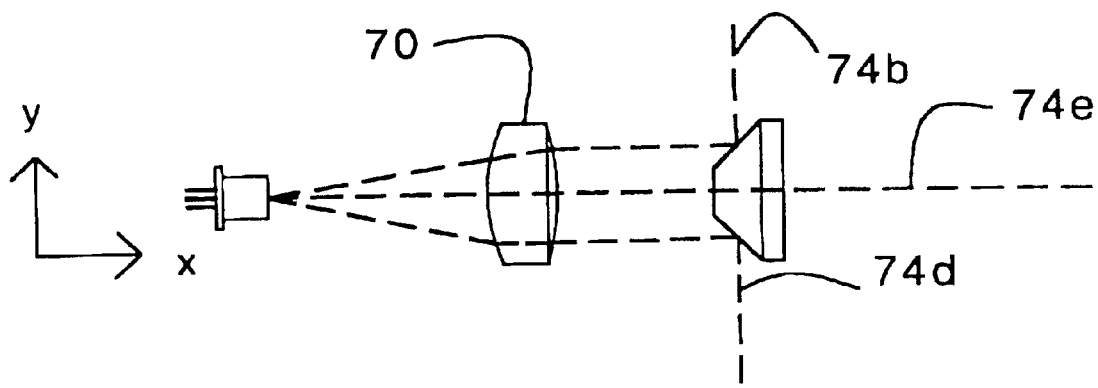
FIG. 9 is an elevation view of the FIG. 8 system.

The natural divergence of the diode beam in the narrow direction is expanded by using a cylindrical lens (not specifically shown) near the face of the diode or by using a cylindrical magnifying telescope after collimating the beam. Alternatively a round beam may be produced using a vertically emitting laser diode. The lens 70 collimates the beam. The pyramid 72 preferably is made of glass with four facets coated for high reflectivity. This produces five beams: 74a, plumb up direction, 74b to one side, 74c, plumb down direction, 74d, opposite side, and 74e, directly transmitted, as shown in FIGS. 8–9.

Figure 10:
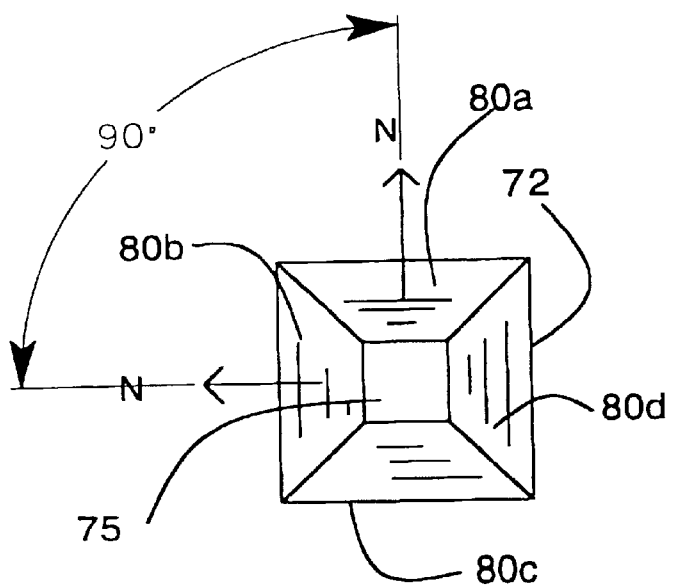
FIGS. 10A, 10B and 10C are elevation and plan views from three sides, showing a reflector element used in the system of FIGS. 8 and 9.
Figure 10B:
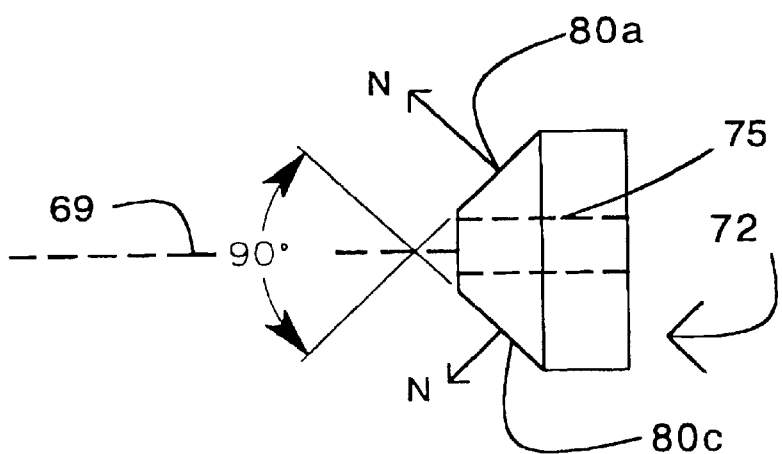
Figure 10C:
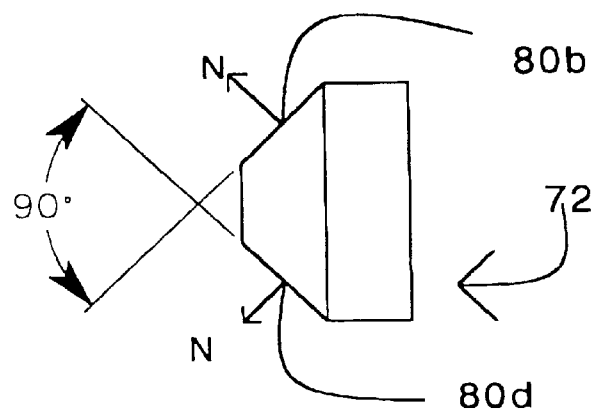

The reflector element 72 is shown in FIGS. 10A–C. The reflecting faces 80a, 80b, 80c, 80d are each at an angle of 45° to the incoming beam 69, and the normals N are shown to the 45° surfaces. The normal vectors N lie in two orthogonal planes whose intersection is parallel to the incoming beam.

Figure 11:
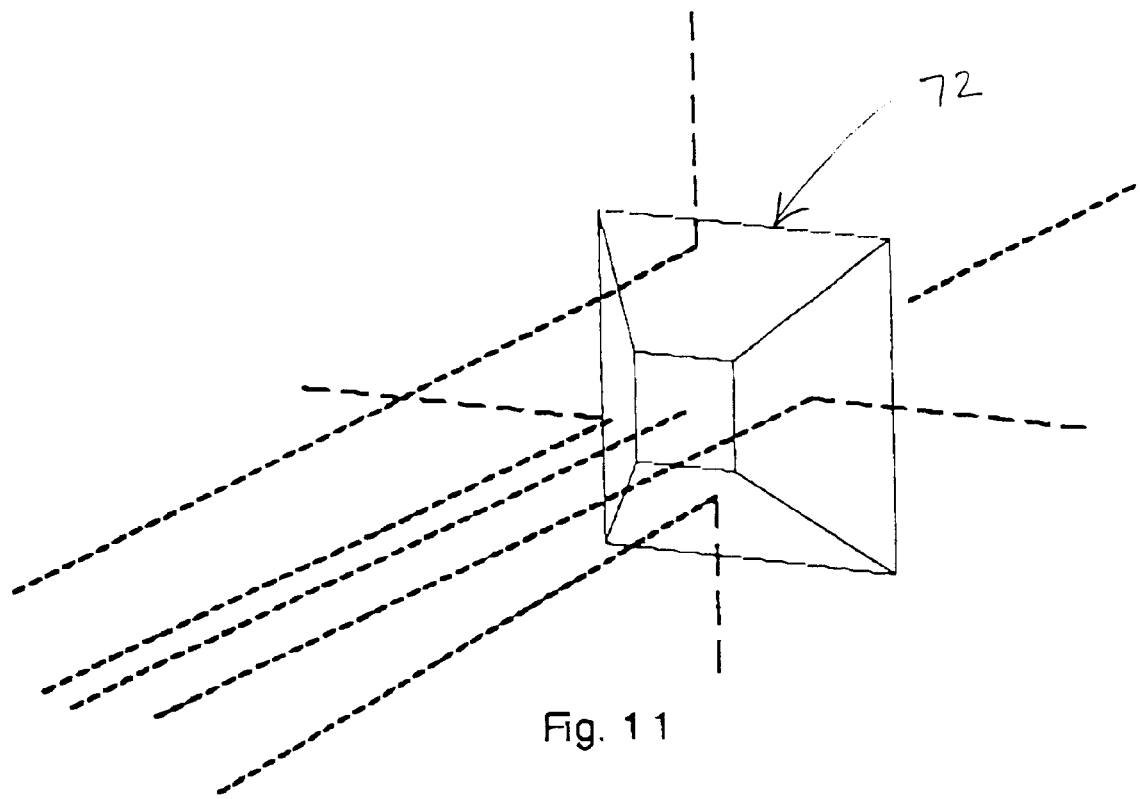
FIG. 11 is a perspective view showing the reflective device of FIG. 10.
Figure 12:
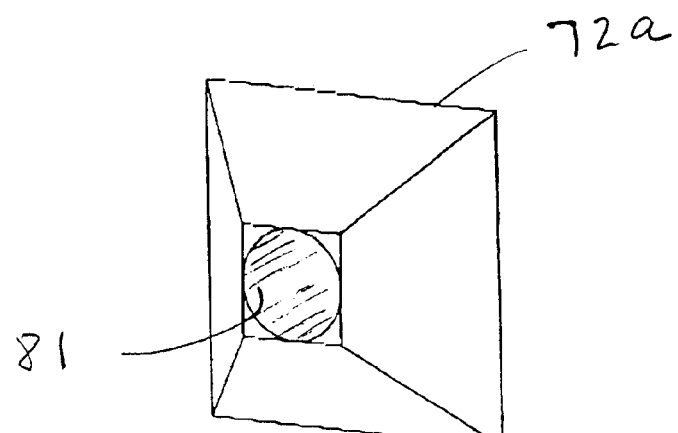
FIG. 12 is another perspective view of the reflector of FIG. 10, showing an open window for a middle portion of the beam.

A perspective drawing of the beams and a glass pyramid 72 with four reflective faces and one transmitting face is shown in FIG. 11. FIG. 12 shows the reflector element 72a with a round transmitting hole 81, to reduce diffraction and improve beam shape, as well as to eliminate the need to make beam entry and exit surfaces of the element precisely parallel. The facet and beam orientations are the same as in FIGS. 10A–10C.

The reflector element 72, 72a could be replaced with a metal element of the same shape, with a round or square hole through it, and with reflective coatings on the four 45° faces.

The angle between the reflecting surfaces used and the collimated beam from the lens in any of the above described beam generating systems must be very precise. To achieve the precise alignment of the beams relative to the reflectors, the collimating lens is moved in a direction perpendicular to the beam axis. In the preferred method shown in FIG. 13 a chassis 82, a die casting for example, has protrusions for mounting various components. The diode 68 is fitted in a tightly fitting hole in a protrusion 82a of chassis. The lens 70 is between two protrusions 82b and is positioned in the y and z directions for pointing the beam at the reflector element 72 and positioned in the x direction for focus via the lens holder 86. A lens holder 86 positions the lens in x,y,z using commercially available micropositioner such as Melles Griot model 07TMC521 or 07TMF021 not shown in the figure. The lens holder 86 can use a vacuum chuck to hold the lens in place or use a mechanical clamping method to hold the lens during positioning. UV cement 84 fills gaps between the lens and the two protrusions 82b on the chassis.

The angular positions of two or more of the beams is monitored optically with uncured cement in place. This optical monitoring can be via marks on a wall 3 to 10 meters from the chassis, or it can be with a long focal length lens projecting a spot on a ccd camera. When the spots are in the correct location the UV light is turned on and the lens is frozen in place. The accurate positioning of the reflector element 72 can be done in the same way.

Figure 13:
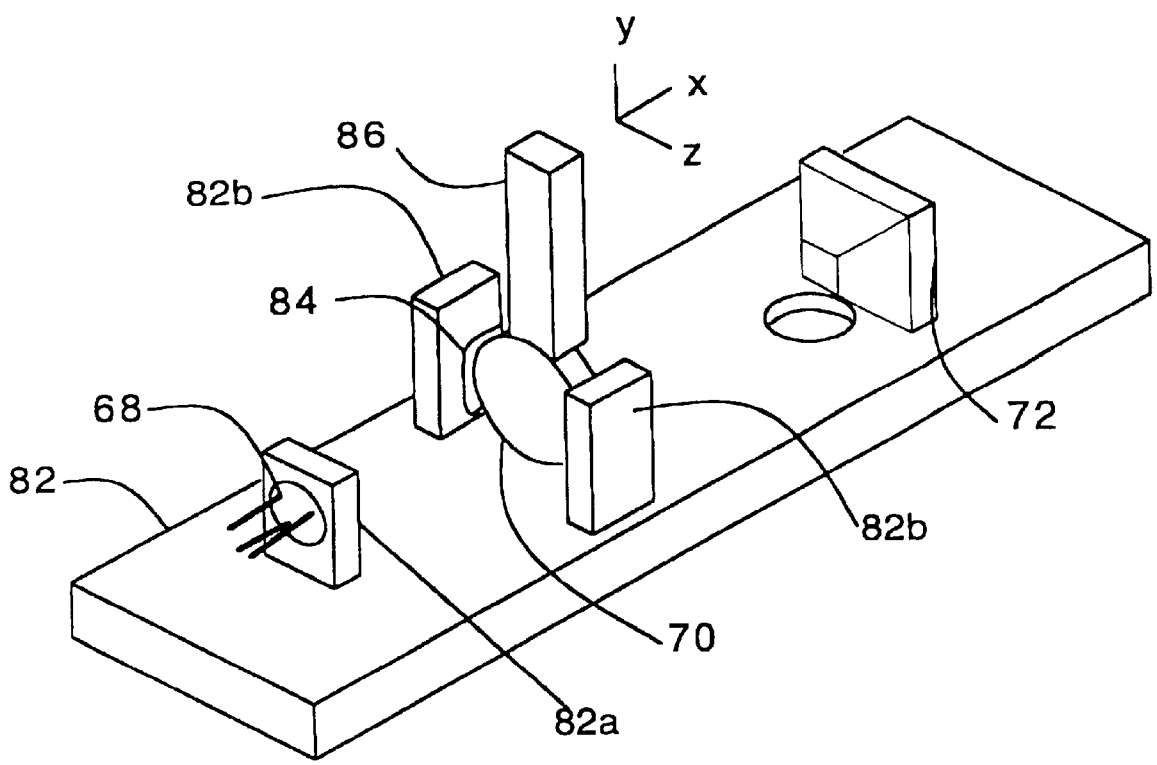
FIG. 13 is a perspective view showing an instrument chassis with a laser diode, collimating lens and reflector device and indicating a calibration method.
Figure 14:
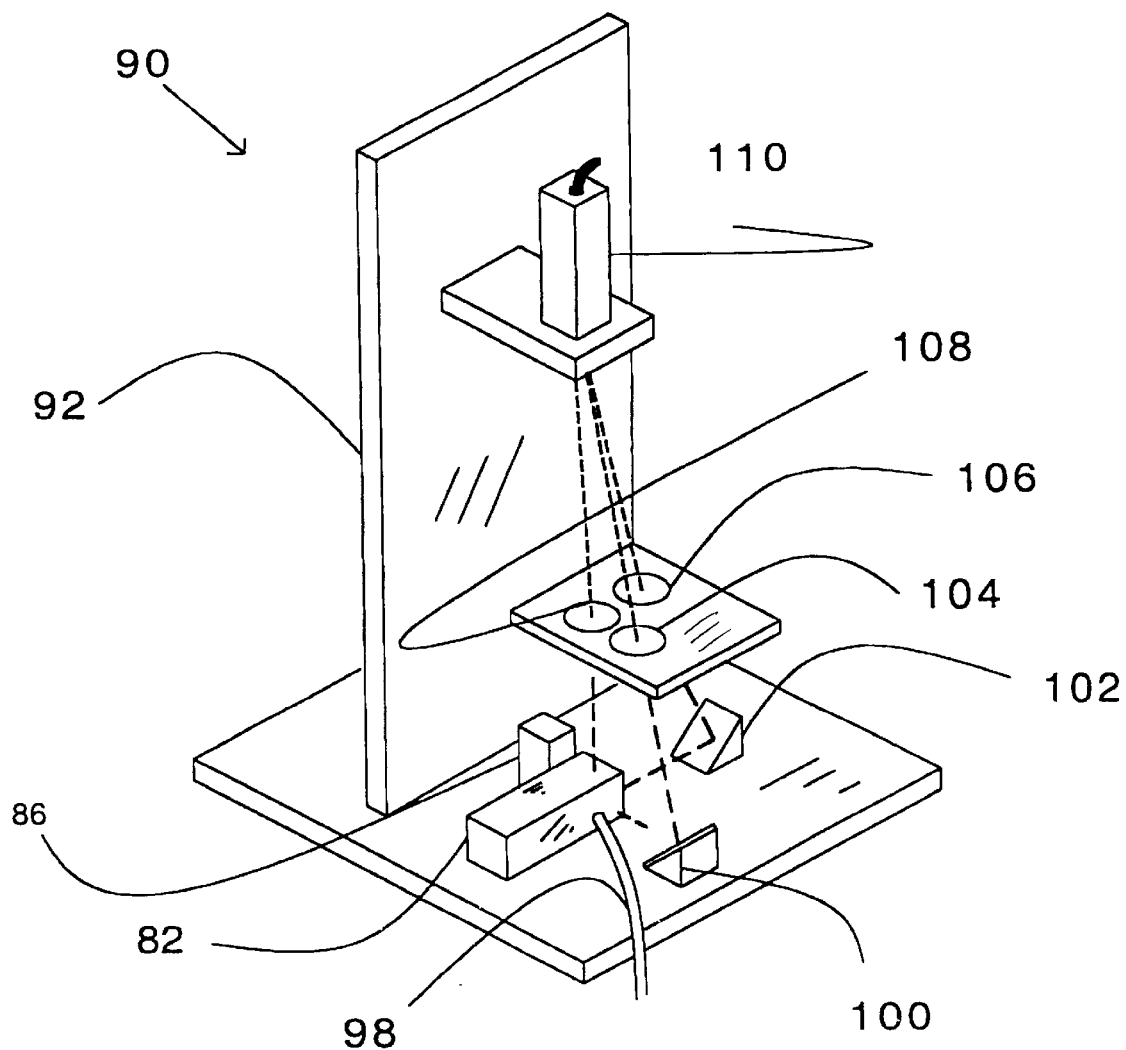
FIG. 14 is a perspective view showing optical monitoring apparatus used to determine the correct angular orientation of the beams in space, prior to cementing the optics in place.

FIG. 14 shows a system generally indicated by 90 for positioning the lens, monitoring the beam angular positions, and freezing the lens in place using UV light. This assumes all beams are accurate relative to each other. A chassis 92 supports the components. The micropositioner 86 shown as a box in the figure, has independent x y z adjustment screws which control the position of the collimating lens. The chassis 82 of FIG. 13 is shown as a box in FIG. 14 for clarity. A UV transmitting fiber 98 conducts UV light from a light generator (not shown) to the cement on the chassis. Reflectors 100 and 102 may be adjusted to direct the beams to the lenses 104 and 106. Lens 108 directs the beam on the camera directly, such that all beams go to a ccd camera 110 mounted on the chassis 92. Note that this system may be extended to five beams by adding reflectors and lenses. In addition the same effect can be achieved by a single large lens and multiple reflectors using simple optical techniques.

Figure 15:
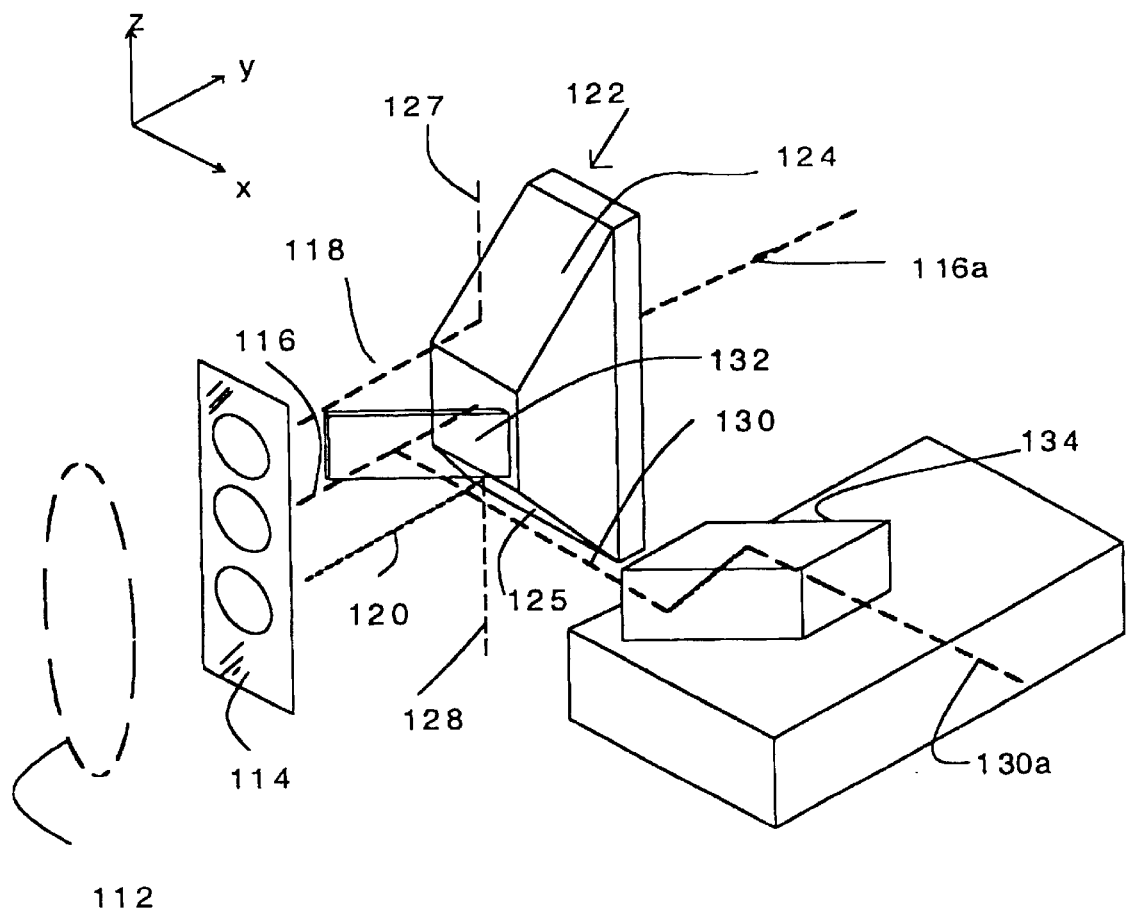
FIG. 15 is a schematic perspective view showing another optical arrangement for producing a plurality of reference beams.

FIG. 15 shows in perspective another embodiment of multiple-reference beam generator optics. A collimated elliptical beam 112 from a laser diode and collimating optics (not shown) is masked into three separate beam portions by a mask 114, generating a middle beam portion 116, an upper beam portion 118 and a lower beam portion 120. The mask can be eliminated if desired, but it helps to shape the beams. A reflector element 122, similar to the element 66 of FIGS. 6 and 7, has upper and lower 45-angled reflective surfaces 124 and 125. As indicated in the drawing, these reflective surfaces of the element 122 produce from the beams 118 and 120 a pair of oppositely directed beams 127 and 128, the beams being substantially collinear and serving as plumb up and plumb down beams. As in the earlier embodiment, the central portion 116 of the beam produces a direct beam 116a, which can be used as a level reference beam, in the same plane as the plumb up and plumb down beams 127 and 128.

A fourth beam 130 is produced by partial reflection of the central beam portion 116, via a 45°-angled beam splitter 132. This second level reference beam, which is orthogonal to all three other beams 116a, 127 and 128, is offset in the direction back toward the mask 114, by virtue of the position of its reflection off the beam splitter 132. This creates an offset relative to the vertical transverse plane containing the plumb beams 127 and 128. To correct this, a simple beam offsetting device 134 can be used, with the beam 130 entering this glass or plastic parallel-faced device at an angle and thus being offset due to the index of refraction of the device. The final output beam 130a is parallel to the beam 130. The device 134 alternatively can be one which uses two total internal reflections to offset the beam, as in a rhomboid shape.

The above described preferred embodiments are intended to illustrate the principles of the invention, but not to limit its scope. Other embodiments and variations to this preferred embodiment will be apparent to those skilled in the art and may be made without departing from the spirit and scope of the invention as defined in the following claims.

We claim:

1. A portable self-leveling instrument for producing a plurality of reference light beams on orthogonal and intersecting lines, comprising:
   a housing with a platform,
   a diode laser source on the platform, providing a laser beam,
   a lens on the platform for collimating the beam, and
   a plurality of reflective surfaces mounted on the platform, positioned obliquely in different portions of the path of the collimated beam so as to reflect the collimated beam to produce a plurality of differently-directed output reference beams, said reflective surfaces including two reflective surfaces each oriented substantially at 45° to the beam and in the path of two opposed outer portions of the collimated beam, so as to produce two oppositely directed output reference beams on essentially the same line, and including orthogonal beam means for producing from a middle portion of the collimated beam, an orthogonal additional reference beam on a line which intersects the other two oppositely directed beams and substantially at 90° to the other two beams.

2. The instrument of claim 1, wherein the orthogonal beam means comprises means for providing said additional reference beam from said middle portion by transmission, without reflection.

3. The instrument of claim 1, wherein the orthogonal beam means comprises a third reflective surface oriented substantially at 45° and in the path of the middle portion of the collimated beam, and producing an orthogonal beam on a line which intersects the other two oppositely direction beams and substantially at 90° to the other two beams.

4. The instrument of claim 1, including a one-piece reflective element having a center portion and having facets positioned outward from the center portion in positions to receive the outer portions of the collimated beam.

5. The system of claim 4, wherein the reflective element comprises a solid glass block.

6. The system of claim 4, wherein the center portion of the reflective element between said facets comprises a beam transmission portion serving as said orthogonal beam means, producing said orthogonal additional reference beam by transmission, without reflection.

7. The system of claim 6, wherein the reflective element comprises a solid glass block.

8. The system of claim 6, wherein the reflective element comprises a solid block with a central hole defining the transmission portion.

9. The system of claim 1, including a reflective element providing said plurality of reflective surfaces, the reflective element having a center portion and having four facets positioned at four sides surrounding the center portion and each substantially at 45° to the collimated beam, two opposed facets being in the path of said two outer portions of the collimated beam and two other opposed facets being in the path of opposed portions of the middle portion of the beam, so as to produce four output reference beams essentially on two intersecting lines by reflection of portions of the collimated beam.

10. The system of claim 9, wherein the center portion of the reflective element comprises a center transmission portion positioned to receive and transmit part of the middle portion of the collimated beam, without reflection, producing a fifth orthogonal beam.

11. The system of claim 10, wherein the reflective element comprises a solid glass block.

12. The system of claim 10, wherein the reflective element has an opening at said center portion for transmission of the fifth beam.

13. The system of claim 9, wherein the reflective element comprises a solid block with a central hole for transmission of a fifth beam.

14. The system of claim 1, including a metal component on the platform, and wherein said two reflective surfaces comprise machined mirror-like finishes on the metal component and oriented substantially at 45° to the beam.

15. A method using a portable laser instrument for laying out construction work, comprising:
   providing a housing of the portable laser instrument, with a pendulously mounted platform in the housing,
   providing a laser diode source on the platform within the housing, and projecting a laser beam from the laser source and through a lens on the platform, thereby collimating the laser beam, providing a plurality of reflective surfaces mounted on the platform, positioned obliquely in different portions of the path of the collimated beam and thereby reflecting the collimated beam from the reflective surfaces to produce a plurality of differently-directed output beams, said reflective surfaces including two reflective surfaces each oriented substantially at 45° to the beam and in the path of two opposed outer portions of the collimated beam, thus producing two oppositely directed output reference beams on essentially the same line, and producing from a middle portion of the collimated beam, and orthogonal additional reference beam on a line which intersects the other two oppositely directed beams and substantially at 90° to the other two beams, and using the three orthogonal beams in construction layout.

16. The method of claim 15, wherein the step of producing the orthogonal additional reference beam comprises providing said additional reference beam from said middle portion by transmission, without reflection.

17. The method of claim 15, wherein the step of producing the orthogonal additional reference beam comprises including a third reflective surface oriented substantially at 45° and in the path of the middle portion of the collimated beam, to produce an orthogonal additional reference beam on a line which intersects the other oppositely directed beams and substantially at 90° to the other two beams, and including using said orthogonal additional reference beam to locate one of said two points.

18. A portable self-leveling instrument for producing a plurality of reference light beams on orthogonal and intersecting lines, comprising:

a housing with a platform, the platform being pendulously mounted within the housing, a diode laser source on the platform, providing a laser beam, a collimating lens on the platform in the path of the laser beam, producing a collimated beam, and three reflective surfaces mounted on the platform, each positioned substantially at 45° to the collimated beam and in different portions of the path of the collimated beam so as to reflect the collimated beam to produce three differently-directed and orthogonally-related output reference beams essentially within a single plane, two of the reference beams being oppositely directed and on essentially the same line.

19. The instrument of claim 18, wherein the collimated beam is generally elliptical in shape with a long dimension and a short dimension, and wherein the two oppositely directed output reference beams are produced by two of said reflective surfaces which are positioned near outer ends of the long dimension of the collimated beam.

20. The instrument of claim 19, wherein the two reflective surfaces producing said oppositely directed output beams are formed at 90° to each other on a single reflective metal component.

21. The instrument of claim 18, including a one-piece reflective element having facets positioned outward from a center, in positions to receive outer portions of the collimated beam, each facet being substantially at 45° to the path of the collimated beam.

22. The instrument of claim 21, wherein the single component comprises a solid block with a central hole defining the transmission portion.

23. The system of claim 18, including a reflective element providing said plurality of reflective surfaces, the reflective element having a center portion and having four facets positioned at four sides surrounding the center portion and each substantially at 45° to the collimated beam, two opposed facets being in the path of said two outer portions of the collimated beam and two other opposed facets being in the path of opposed portions of the middle portion of the beam, so as to produce four output reference beams essentially on two intersecting lines by reflection of portions of the collimated beam.

24. The instrument of claim 18, including a metal component on the platform, and wherein said three reflective surfaces comprise machined mirror-like finishes on the metal component, each oriented substantially at 45° to the beam.

25. A method involving a portable laser instrument for producing orthogonally related laser beams and using the beams for laying out construction work, comprising:

providing a housing of the portable laser instrument, and a platform within the housing having a laser diode source secured to the platform, collimating a laser beam of the laser diode source, securing to the platform three reflective surfaces, positioned obliquely in different portions of the path of the collimated beam so as to reflect the collimated beam to produce three differently-directed and orthogonally-related output reference beams essentially within a single plane, two of the reference beams being oppositely directed and on essentially the same line, and using the three orthogonal beams projected from the portable laser instrument in construction layout.

* * * * *